United States Patent [19]

Melas et al.

[11] Patent Number: 5,120,676

[45] Date of Patent: Jun. 9, 1992

[54] USE OF PHOSPHINE AND ARSINE COMPOUNDS IN CHEMICAL VAPOR DEPOSITION AND CHEMICAL DOPING

[75] Inventors: Andreas A. Melas, Burlington; Ravi K. Kanjolia, North Andover; Ben C. Hui, Peabody, all of Mass.

[73] Assignee: CVD Incorporated, Woburn, Mass.

[21] Appl. No.: 498,868

[22] Filed: Mar. 23, 1990

[51] Int. Cl.$^5$ .............................................. H01L 21/20
[52] U.S. Cl. ..................................... 437/81; 437/105; 437/107; 437/959; 156/606; 156/613
[58] Field of Search ...................... 148/DIG. 2, 40, 41, 148/56, 65, 110, 119, 169; 156/610–614; 427/848.1, 255.1; 437/81, 88, 105, 107, 126, 133, 165, 951, 959, 987, 971

[56] References Cited

U.S. PATENT DOCUMENTS

| | | | |
|---|---|---|---|
| 4,340,617 | 7/1982 | Deutsch et al. | 427/53.1 |
| 4,524,090 | 6/1985 | Bottka | 437/234 |
| 4,626,448 | 12/1986 | Hays | 427/39 |
| 4,721,683 | 1/1988 | Ward | 437/38 |
| 4,734,514 | 3/1988 | Melas et al. | 556/70 |
| 4,792,467 | 12/1988 | Melas et al. | 427/255 |
| 4,814,203 | 3/1989 | DePriest | 427/248.1 |
| 4,900,855 | 2/1990 | Hui et al. | 556/70 |

FOREIGN PATENT DOCUMENTS 0123099 6/1987 Japan.
0738390 6/1987 Japan.

OTHER PUBLICATIONS

Speckman et al., "Alternatives to Arsine . . . Using Triethylarsenic," Appl. Phys. Lett., vol. 50, No. 11, Mar. 16, 1987, pp. 676–678.
Chen et al., "Use of Tertiary Butyl Arsine for GaAs Growth," Appl. Phys. Lett., vol. 50, No. 4, Jan. 26, 1987, pp. 218–220.
Ludowise et al., "Use of Column V Alkyls in Organometallic Vapor Phase Epitoxy (OMVPE)," SPIE, vol. 323, 1982, pp. 117–124.
Maury et al., . . . "Pyrolysis of Organometallic Precursors Usable in GaAs Vapor Phase Epitaxy," J. Crys. Growth, vol. 91, No. 1–2, 1988, pp. 105–110.

Primary Examiner—Olik Chaudhuri
Assistant Examiner—William Bunch
Attorney, Agent, or Firm—Wayne F. Nacker; Gerald K. White

[57] ABSTRACT

A MOCVD process for depositing an arsenic-containing film or a phosphorous-containing film utilizing a diprimary phosphine or arsine or an unsaturated hydrocarbon phosphine or arsine.

7 Claims, No Drawings

USE OF PHOSPHINE AND ARSINE COMPOUNDS IN CHEMICAL VAPOR DEPOSITION AND CHEMICAL DOPING

The present invention is directed to chemical vapor deposition and chemical doping with the novel use of arsine and phosphine compounds.

BACKGROUND OF THE INVENTION

Metal organic chemical vapor deposition (MOCVD) for producing, for example, III-V films on various substrates are well known and well documented in the literature. A few references to this subject, all disclosures of which are incorporated herein by reference, include U.S. Pat. Nos. 3,101,280, 3,218,203, 3,224,913, 3,226,270, 3,261,726, 3,312,570, 3,312,571, 3,342,551, 3,364,084, 4,368,098 and 4,404,265.

Chemical doping of materials, particularly semiconductor materials, is carried out in a similar manner to epitaxial growth of films by MOCVD. However, in doping, the substrate material is placed in the reaction chamber and lower levels of the metal-yielding compound are introduced.

Arsine ($AsH_3$) had been the standard arsenic source for MOCVD processes for epitaxial growth films, such as III-V films. However, due to the hazard posed by this toxic and gaseous material, substitutes for arsine are sought for MOCVD processes as well as arsenic doping processes.

Likewise, phosphine ($PH_3$) had been the standard phosphorous source for MOCVD processes for epitaxial growth films and chemical doping. Similar considerations with respect to toxicity are true of phosphine as well.

The present invention is directed to the novel use of arsenic and phosphorous compounds in MOCVD and chemical doping processes.

SUMMARY OF THE INVENTION

In accordance with the invention, diprimary phosphines and arsines and unsaturated hydrocarbon phosphines and arsines are used to deposit by MOCVD epitaxial growth or chemical doping, phosphorous or arsenic.

DETAILED DESCRIPTION OF CERTAIN PREFERRED EMBODIMENTS

The diprimary arsines useful in accordance with the present invention have the general formula:

(I) $H_2M-(CX^1_2)_a(CX^2_2)_b(CX^1_2)_c-MH_2$, wherein the M's are either P or As, the $X^1$s are the same or different and are each selected from H and a halogen, such as Br, Cl, or F; the $X^2$s are the same or different and are selected from H, a halogen, such as Br, Cl or F, and short-chain hydrocarbon radicals or short-chain hydrocarbon radicals substituted with halogens; a is from 1 to 4, b is from 0 to 2, and c is 0 or 1; provided that if b is 1 or 2, c is 1 and provided that $a+b+C=1$ to 4. If any $X^2$ is a hydrocarbon or substituted hydrocarbon radical, preferably the total number of carbon atoms in the molecule is six or fewer.

The unsaturated arsines and phosphines of the present invention have the general formula:

(II) $R^u_d MH_n$ wherein M is either P or As, d is 1 to 3, $n=3-d$, and the $R^u$s are the same or different and each has the general formula (A) or (B):

(A) $-(CX^1_2)_e-CX^1=CX^1_f-(CX^1_2)_g-(CX^1_3)_h$ wherein the $X^1$s are the same or different and are selected from H and a halogen, such as Br, Cl or F; wherein e is from 0 to 2; f is 1 or 2; g is 0 or 1; and h is 0 or 1, provided that $e+g+h=0$ to 2; if g and h are each 0, then f=2; if f is 1, then h is 1, or (B) $-(CX^1_2)_i-C\equiv CX^1_j-(CX^1_2)_k-(CX^1_3)_l$;

wherein the $X^1$s are the same or different and are as defined above; wherein i is from 0 to 2; j is 0 or 1; k is 0 or 1; and l is 0 or 1; $i+k+l=0$ to 2; if k and l are each 0, then j=1; if l=1, then j=0; or the general formula:

(III) $-CX^1=CX^1-CX^1=CX^1_2$; wherein the $X^1$s are the same or different and defined as above.

Preferably in each of formulae I-III above, each $X^1$ is H; preferably in formula I, any $X^2$ is M, or a hydrocarbon radical, most preferably each $X^2$ is H.

The diprimary phosphine or arsine compounds used in accordance with the present invention have the advantage of providing two $H_2M$. radicals per molecule; thus a relatively high amount of either arsenic or phosphorous is available for deposition. Furthermore, the hydrocarbon chain radical that is left has a pair of, rather than a single, free radical electrons, and this stabilizes the hydrocarbon chain radical. As a result, the bond between the hydrocarbon chain and the arsenic or phosphorous atom is easier to break and therefore results in greater efficiency of arsenic or phosphorous deposition.

In formulae II and III, the C=C double or C≡C triple bond(s) tends to stabilize the free radical that results when the arsenic or carbon atom splits from its bonding to carbon. Again, the stabilization of the radical facilitates breaking of M—C bonds, resulting in greater efficiency of arsenic or phosphorous deposit. For most efficient stabilization of the radical, it is preferred that formula II(A) in the $R^u$ group(s), the C=C bond is alpha or beta to the M-C bond, i.e., e or i is 0 or 1; leaving a vinyl or allyl radical or that in formula II(B) the C≡C bond is alpha or beta to the M—C bond.

Suitable chemicals within these general formulae are liquid at a temperature whereat they are stable against decomposition and from which they can be vaporized, e.g., by bubbling carrier gas therethrough, for transport into a deposition chamber. At such temperature, the compounds should have a sufficiently high vapor pressure for the intended use. For epitaxial growth by MOCVD, it is preferred that the compound have a vapor pressure of at least 1 torr at the vaporizing temperature. For chemical doping, the vapor pressure may be considerably less.

Generally, the lower the molecular weight(s) of the carbon chain(s), the higher the vapor pressure of the organo arsenic or organo phosphorous although other factors, such as the symmetry or asymmetry of the molecule may affect this.

Examples of suitable compounds include but are not limited to:

| Compounds | B.P. | M.P. | CAS # |
|---|---|---|---|
| $H_2PCH_2CH_2PH_2$ | 114–117 | −62.5 | 5518-62-7 |
| $H_2PCH_2PH_2$ | 76–77 | — | 5518-61-6 |
| $H_2P(CH_2)_3PH_2$ | 129–131 | — | 3619-91-8 |

-continued

| Compounds | B.P. | M.P. | CAS # |
|---|---|---|---|
| $H_2P(CH_2)_4PH_2$ | 170–172; 64 5/13 mm | −52.5 | 5518-64-9 |
| $CH_2{=}CHCH_2PH_2$ | 45° C./760 mm (Log P = 8.251 − 1.709 × $10^3$/T) | | 81637-99-2 |
| $(CH_2{=}CH)_3P$ | 117° C. Log P = 7.399 − 1763/T | −110.0° C. | 3746-01-8 |
| $CH_2{=}CHCH_2CH_2PH_2$ | 88.1° C. (Log P = 7.869 − 1.802 $10^3$/T | — | 114596-01-9 |
| $(CH_2{=}CH)PH_2$ | | | |
| $H_2C{=}CCH_2PH_2$ | 37–65 torr/0° C. | | 114596-02-0 |
| $HC{\equiv}CPH_2$ | | | |
| $CH_2{=}C(CH_3){-}PH_2$ | | | |
| $H_2As{-}CH_2{-}AsH_2$ | | | |
| $H_2As{-}CH_2CH_2{-}AsH_2$ | | | |
| $H_2C{=}CH{-}CH_2{-}AsH_2$ | | | |
| $H_2C{=}CH{-}AsH_2$ | | | |

Mixtures of organo phosphorous and mixtures of organo arsenic compounds may also be used, but mixtures are problematic for lack of a consistant vapor pressure throughout a deposition.

These organoarsine compounds and organophosphorous compounds are substantially less hazardous than arsine and phosphine.

The invention will now be described in greater detail by way of specific examples.

EXAMPLE 1

Mocvd Process

Bisphosphino ethane is placed in a bubbler and suitably interconnected with a source of hydrogen gas and a deposition chamber. The chamber is also supplied with trimethylindium contained in a separate bubbler. The bisphosphino ethane bubbler is maintained at 20° C., using suitable heating or cooling devices. The deposition chamber is maintained at 600° C., and an indium phosphide substrate is supported within the deposition chamber. The entraining hydrogen is delivered at about 5 to 10 liters per minute (at standard temperature and pressure). The partial pressure of hydrogen in the deposition chamber is atmospheric pressure, and the partial pressure of the bisphosphino ethane is about 18 torrs, the partial pressure of trimethylindium is about 35 torrs. Deposition of indium phosphide of various thickness is found on the substrate.

EXAMPLE 2

Bisarsino Ethane as Dopant

Arsenic-doped mercury cadmium telluride layers are grown in an atmospheric pressure reactor using diisopropyl telluride, dimethylcadmium, and elemental mercury. Bisarsino ethane in a bubbler at about 20° C. is used as a dopant source. The subtrate used is semi-insulating gallium arsenide and the growth temperature is about 350° C. Hydrogen is used as a carrier gas.

While the invention has been described in terms of certain preferred embodiments, modifications obvious to one with ordinary skill in the art may be made without departing from the scope of the present invention.

Various features of the invention are set forth in the following claims.

What is claimed is:

1. In a process for vapor deposition for producing an arsenic-containing or a phosphorous-containing film on a substrate by thermally decomposing a vaporous organo arsenic compound or a vaporous organo phosphorous compound on a heated substrate or a chemical doping process in which an organo arsenic compound or an organo phosphorous compound is used to introduce arsenic atoms or phosphorous into a substrate, the improvement comprising said organo arsenic compound or organo phosphorous compound being selected from the formulae:

(I) $H_2M{-}(CX^1_2)_a(CX^2_2)_b(CX^1_2)_c{-}MH_2$, wherein the Ms are either P or As, the $X^1$s are the same or different and are each selected from the group H, consisting of Br, Cl and F; the $X^2$s are the same or different and are selected from the group consisting of H, Br, Cl, F, short-chain hydrocarbon radicals and short-chain hydrocarbon radicals substituted with halogens; a is from 1 to 4, b is from 0 to 2, and c is 0 or 1; provided that if b is 1 or 2, c is 1 and provided that a+b+C=1 to 4;

(II) $R^u_d MH_n$ wherein M is either P or As, d is 1 to 3, n=3-d, and the $R^u$s are the same or different and each has the general formula (A) or (B):

(A) $-(CX^1_2)_e{-}CX^1{=}CX^1{-}(CX^1_2)_g{-}(CX^1_3)_h$ wherein the $X^1$s are the same or different and are selected from the group consisting of H, Br, Cl and F; wherein e is from 0 to 2; f is 1 or 2; g is 0 or 1; and h is 0 or 1, provided that e+g+h=0 to 2; if g and h are each 0, then f=2; if f is 1, then h is 1, or (B) $-(CX^1_2)_i{-}C{\equiv}CX^1{-}(CX^1_2)_k{-}(CX^1_3)_l$; wherein the $X^1$s are the same or different and are as defined above; wherein i is from 0 to 2; j is 0 or 1; k is 0 or 1; and l is 0 or 1; i+k+l=0 to 2; if k and l are each 0, then j=1; if l=1, then j=0; or the general formula:

(III) $-CX^1{=}CX^1{-}CX^1{=}CX^1_2$; wherein the $X^1$s are the same or different and defined as above.

2. A process according to claim 1 wherein the formulae I-III, M is P.

3. A process according to claim 2 wherein the organo phosphorous compound is selected from the group consisting of: $H_2PCH_2CH_2PH_2$, $H_2PCH_2PH_2$, $H_2P(CH_2)_3PH_2$, $H_2P(CH_2)_4PH_2$, $CH_2{=}CHCH_2PH_2$, $(CH_2{=}CH)_3P$, $CH_2{=}CHCH_2CH_2PH_2$, $(CH_2{=}CH)PH_2$, $H_2C{=}CCH_2PH_2$, $HC{\equiv}CPH_2$, and $CH_2{=}C(CH_3){-}PH_2$.

4. A process according to claim 1 wherein the formulae I-III, M is As.

5. A process according to claim 4 wherein the organo arsenic compound is selected from the group consisting of: $H_2As-CH_2-AsH_2$, $H_2As-CH_2CH_2-AsH_2$, $H_2C=CH-CH_2-AsH_2$, and $H_2C=CH-AsH_2$.

6. A process according to claim 1 wherein in any of formulae I-III, each $X^1$ is H, and in formula I, any $X^2$ is H or a hydrocarbon radical.

7. A process according to claim 6 wherein in formula I, any $X^2$ is H.

* * * * *